(12) United States Patent
Hasegawa et al.

(10) Patent No.: US 10,886,103 B2
(45) Date of Patent: Jan. 5, 2021

(54) DATA PROCESSING METHOD, DATA PROCESSING APPARATUS, AND MULTIPLE CHARGED-PARTICLE BEAM WRITING APPARATUS

(71) Applicant: NuFlare Technology, Inc., Yokohama (JP)

(72) Inventors: Kei Hasegawa, Yokohama (JP); Yoshiaki Onimaru, Yokohama (JP); Hayato Kimura, Suntou-gun (JP)

(73) Assignee: NuFlare Technology, Inc., Yokohama (JP)

( * ) Notice: Subject to any disclaimer, the term of this patent is extended or adjusted under 35 U.S.C. 154(b) by 36 days.

(21) Appl. No.: 16/432,009

(22) Filed: Jun. 5, 2019

(65) Prior Publication Data

US 2019/0378688 A1 Dec. 12, 2019

(30) Foreign Application Priority Data

Jun. 8, 2018 (JP) .................. 2018-110463

(51) Int. Cl.
*H01J 37/30* (2006.01)
*H01J 37/317* (2006.01)
(Continued)

(52) U.S. Cl.
CPC .......... *H01J 37/302* (2013.01); *H01J 37/045* (2013.01); *H01J 37/09* (2013.01); *H01J 37/20* (2013.01);
(Continued)

(58) Field of Classification Search
CPC ........ H01J 37/302; H01J 37/20; H01J 37/045; H01J 37/09; H01J 37/3177; H01J 37/3174;
(Continued)

(56) References Cited

U.S. PATENT DOCUMENTS 6,259,084 B1 7/2001 Kochis et al.
9,837,247 B2 12/2017 Kato et al.
(Continued)

FOREIGN PATENT DOCUMENTS

JP 2001-76991 3/2001
JP 2004-186513 7/2004
(Continued)

OTHER PUBLICATIONS

Combined Taiwanese Office Action and Search Report dated Mar. 10, 2020 in corresponding Taiwanese Patent Application No. 108117248 (with English Translation), 12 pages.

*Primary Examiner* — Nicole M Ippolito
*Assistant Examiner* — Sean M Luck
(74) *Attorney, Agent, or Firm* — Oblon, McClelland, Maier & Neustadt, L.L.P.

(57) ABSTRACT

In one embodiment, a data processing method is for processing data in a writing apparatus performing multiple writing by using multiple beams. The data is for controlling an irradiation amount for each beam. The method includes generating irradiation amount data for each of a plurality of layers, the irradiation amount data defining an irradiation amount for each of a plurality of irradiation position, and the plurality of layers corresponding to writing paths in multiple writing, performing a correction process on the irradiation amounts defined in the irradiation amount data provided for each layer, calculating a sum of the irradiation amounts for the respective irradiation positions defined in the corrected irradiation amount data, comparing the sums between the plurality of layers, and determining whether or not an error has occurred in the correction process based on the comparison result.

19 Claims, 5 Drawing Sheets

(51) Int. Cl.
  *H01J 37/20* (2006.01)
  *H01J 37/302* (2006.01)
  *H01J 37/04* (2006.01)
  *H01J 37/09* (2006.01)

(52) U.S. Cl.
  CPC ..... *H01J 37/3177* (2013.01); *H01J 2237/043* (2013.01); *H01J 2237/0453* (2013.01); *H01J 2237/153* (2013.01); *H01J 2237/202* (2013.01); *H01J 2237/24507* (2013.01); *H01J 2237/30416* (2013.01)

(58) Field of Classification Search
  CPC ....... H01J 2237/043; H01J 2237/24507; H01J 2237/202; H01J 2237/0453; H01J 2237/153; H01J 2237/30416
  See application file for complete search history.

(56) References Cited

U.S. PATENT DOCUMENTS

| | | |
|---|---|---|
| 10,199,200 B2 | 2/2019 | Kato et al. |
| 10,483,087 B2 | 11/2019 | Hasegawa et al. |
| 2003/0005390 A1 | 1/2003 | Takashima et al. |
| 2004/0104357 A1 | 6/2004 | Fujiyoshi et al. |
| 2012/0001097 A1* | 1/2012 | Yashima ............. H01J 37/3174 250/492.22 |
| 2014/0021655 A1 | 1/2014 | Hirata et al. |
| 2015/0041684 A1 | 2/2015 | Kato et al. |
| 2015/0242563 A1* | 8/2015 | Wieland ............. G03F 7/70475 438/798 |
| 2016/0276132 A1* | 9/2016 | Platzgummer ...... H01J 37/3177 |
| 2016/0322196 A1 | 11/2016 | Hasegawa et al. |
| 2017/0243714 A1 | 8/2017 | Hasegawa et al. |
| 2018/0005799 A1 | 1/2018 | Hasegawa et al. |
| 2018/0061614 A1 | 3/2018 | Kato et al. |

FOREIGN PATENT DOCUMENTS

| | | |
|---|---|---|
| JP | 2005-53000 | 3/2005 |
| JP | 2006-121739 | 5/2006 |
| JP | 4187947 | 11/2008 |
| JP | 2014-39011 | 2/2014 |
| JP | 2014-48349 | 3/2014 |
| JP | 2016-207971 | 12/2016 |
| JP | 2017-152485 | 8/2017 |
| TW | 201724155 A | 7/2017 |
| TW | 201812461 A | 4/2018 |

* cited by examiner

FIG.5

| 1st LAYER | | 2nd LAYER | | 3rd LAYER | | 4th LAYER | |
|---|---|---|---|---|---|---|---|
| G1 | G2 | G1 | G2 | G1 | G2 | G1 | G2 |
| 12.5 | 12.5 | 12.5 | 12.5 | 12.5 | 12.5 | 12.5 | 12.5 |
| G3 | G4 | G3 | G4 | G3 | G4 | G3 | G4 |
| 12.5 | 12.5 | 12.5 | 12.5 | 12.5 | 12.5 | 12.5 | 12.5 |

FIG.6

| 1st LAYER | | 2nd LAYER | | 3rd LAYER | | 4th LAYER | |
|---|---|---|---|---|---|---|---|
| G1 | G2 | G1 | G2 | G1 | G2 | G1 | G2 |
| 12.5 | 12.5 | 12.5 | 12.5 | 12.5 | 12.5 | 12.5 | 12.5 |
| G3 | G4 | G3 | G4 | G3 | G4 | G3 | G4 |
| 12.5 | 12.5 | 12.5 | 6.66 | 12.5 | 6.66 | 12.5 | 6.66 |

ALWAYS-ON(30 $\mu$C)

FIG.7

| 1st LAYER | | 2nd LAYER | | 3rd LAYER | | 4th LAYER | |
|---|---|---|---|---|---|---|---|
| G1 | G2 | G1 | G2 | G1 | G2 | G1 | G2 |
| 12.5 | 12.5 | 12.5 | 12.5 | 12.5 | 12.5 | 12.5 | 12.5 |
| G3 | G4 | G3 | G4 | G3 | G4 | G3 | G4 |
| 12.5 | 12.5 | 12.5 | 16.6 | 12.5 | 16.6 | 12.5 | 16.6 |

ALWAYS-OFF(0 $\mu$C)

DATA PROCESSING METHOD, DATA PROCESSING APPARATUS, AND MULTIPLE CHARGED-PARTICLE BEAM WRITING APPARATUS

CROSS REFERENCE TO RELATED APPLICATION

This application is based upon and claims benefit of priority from the Japanese Patent Application No. 2018-110463, filed on Jun. 8, 2018, the entire contents of which are incorporated herein by reference.

FIELD

The present invention relates to a data processing method, a data processing apparatus, and a multiple charged-particle beam writing apparatus.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

Compared with the case of performing writing by using a single electron beam, a writing apparatus using multiple beams may emit many beams at a time, achieving a considerable increase in the throughput. For example, in a multibeam writing apparatus using a blanking aperture array, which is one form of a multibeam writing apparatus, an electron beam having been emitted from a single electron gun passes through a shaping aperture array having multiple openings. Thus, multiple beams (multiple electron beams) are formed. The multiple beams pass through the respective blankers of the blanking aperture array. The blanking aperture array includes electrode pairs for deflecting the beams individually, and also includes openings through which the beams pass and which are disposed between the respective electrode pairs. The potential of one electrode of an electrode pair (blanker) is fixed to the ground potential, and the potential of the other electrode is switched between the ground potential and a potential different from the ground potential. Thus, blanking deflection is performed on the passing electron beams individually. Electron beams having been deflected by blankers are blocked, and electron beams which have not been deflected are emitted onto a sample.

In electron beam writing, a multiple writing method is known. In the multiple writing method, a writing area is divided into multiple stripe areas, and writing is performed on each stripe area. To improve accuracy of connection between patterns at the position of a boundary between stripe areas, multiple layers are formed by shifting the position of the boundary between stripe areas. The same pattern is written repeatedly in an overlapping manner.

In a writing apparatus, to improve accuracy in writing, various calculations for correction of beam irradiation amounts are performed. Upon acquisition of a calculation result, the result is stored in a memory. When an error occurs in data processing, such as the various calculations, writing of data in the memory, and reading of data from the memory, abnormal writing, such as degradation in writing-pattern accuracy or a pattern dropout, is caused. Accordingly, it is necessary to detect an error.

In a single-beam writing apparatus employing a variable shaped beam (VSB) of the related art, even when the position of a boundary between stripe areas is shifted, the sum of the areas of written figures in one layer matches that in another layer. This feature is used to compare the sum of the areas of the written figures in one layer with that in another layer, and detect whether or not an error is present. However, a multiple-beams writing apparatus performs writing, not by using figure data, but by using gradation data which indicates irradiation time and which is expressed as a bit map. Therefore, the error detection method in the single-beam writing apparatus is not capable of being applied.

BRIEF DESCRIPTION OF THE DRAWINGS

FIG. 5 is a diagram illustrating exemplary irradiation amounts for each layer.

FIG. 6 is a diagram illustrating exemplary irradiation amounts for each layer after correction.

FIG. 7 is a diagram illustrating exemplary irradiation amounts for each layer after correction.

DETAILED DESCRIPTION

In one embodiment, a data processing method is for processing data in a writing apparatus performing multiple writing by using multiple beams formed of charged-particle beams. The data is for controlling an irradiation amount for each beam. The method includes generating irradiation amount data for each of a plurality of layers, the irradiation amount data defining an irradiation amount for each of a plurality of irradiation position, the plurality of irradiation positions being obtained by dividing a writing area of a substrate in a mesh shape virtually, the substrate being a writing target, the plurality of layers corresponding to writing paths in multiple writing, performing a correction process on the irradiation amounts defined in the irradiation amount data provided for each of the plurality of layers, and calculating a sum of the irradiation amounts for the respective irradiation positions, the irradiation amounts being defined in the irradiation amount data after the correction process for each of the plurality of layers, comparing the sums between the plurality of layers, and determining whether or not an error has occurred in the correction process on a basis of the comparison result.

An embodiment of the present invention will be described below on the basis of the drawings. In the present embodiment, a configuration using electron beams as an example of charged-particle beams is described. However, charged-particle beams are not limited to electron beams, and may be beams using charged particles, such as ion beams.

Figure 1:
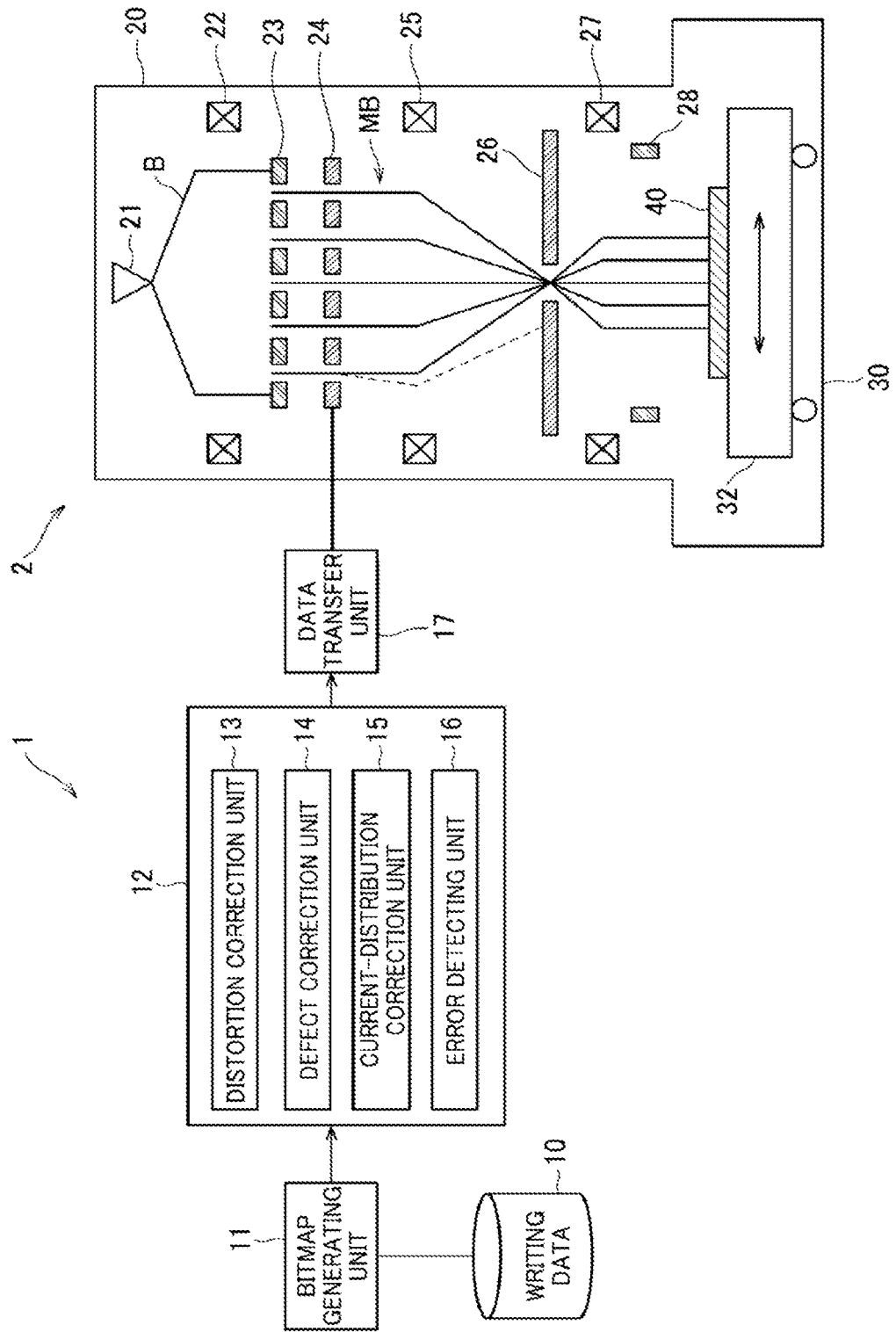
FIG. 1 is a schematic diagram of a writing apparatus according to an embodiment of the present invention.

FIG. 1 is a schematic configuration view of a writing apparatus according to the present embodiment. The writing apparatus includes a controller 1 and a writing unit 2. The writing apparatus is an exemplary multiple charged-particle beam writing apparatus. The writing unit 2 includes an electron optical column 20 and a writing chamber 30. In the electron optical column 20, an electron gun 21, an illumination lens 22, a shaping aperture member 23 (a shaping aperture plate), a blanking plate 24, a reduction lens 25, a limiting aperture member 26, an objective lens 27, and a deflector 28 are disposed. Both of the reduction lens 25 and the objective lens 27 are formed by using electromagnetic lenses. The reduction lens 25 and the objective lens 27 form a demagnifying optical system.

An XY stage 32 is disposed in the writing chamber 30. A substrate 40 that is a writing target is mounted on the XY stage 32. The substrate 40 is, for example, an exposure mask used when semiconductor devices are manufactured, a semiconductor substrate (silicon wafer) on which semiconductor devices are manufactured, or mask blanks to which a resist has been applied and on which writing has not been performed.

The controller 1 includes a storage device 10 such as a magnetic disk unit, a bitmap generating unit 11, a correction unit 12, and a data transfer unit 17. The correction unit 12 includes a distortion correction unit 13, a defect correction unit 14, a current-distribution correction unit 15, and an error detecting unit 16. The bitmap generating unit 11, the correction unit 12, and the data transfer unit 17 may be formed as hardware such as electric circuits, or may be formed as software. When a software configuration is employed, programs implementing at least a subset of the functions may be stored in a recording medium, and may be read for execution by a computer including electric circuits.

FIG. 1 illustrates the configuration necessary for the description of the present embodiment. The other known configuration necessary for operations of the writing apparatus is not illustrated.

In the shaping aperture member 23, holes (openings) of m vertical rows (the y direction) and n horizontal columns (the x direction) (m, n≥2) are formed in a matrix in a given array pitch. Each hole is formed in the same-sized rectangular or circular shape.

The illumination lens 22 causes an electron beam B, which is emitted from the electron gun 21, to radiate onto the entire shaping aperture member 23 almost vertically by using the illumination lens 22. The electron beam B passes through the multiple holes of the shaping aperture member 23. Thus, for example, rectangular electron beams (multiple beams) MB are formed.

In the blanking plate 24, through holes are formed in agreement with the positions at which the respective holes of the shaping aperture member 23 are disposed. For each through hole, a pair of two electrodes (blanker: blanking deflector) is disposed. For one of the two electrodes for each beam, an amplifier for applying a voltage is disposed. The other electrode is grounded. The electron beam passing through each through hole is independently deflected by using the voltage applied to the pair of two electrodes. Blanking control is exerted through this electron beam deflection.

The multiple beams MB having passed through the blanking plate 24 are demagnified by using the reduction lens 25, and travel toward the center hole formed in the limiting aperture member 26. Electron beams deflected by using blankers of the blanking plate 24 are displaced from the center hole of the limiting aperture member 26, and are blocked by the limiting aperture member 26. In contrast, electron beams which have not been deflected by blankers pass through the center hole of the limiting aperture member 26.

Thus, the limiting aperture member 26 blocks the beams which are deflected by the individual blanking mechanism so as to enter the beam OFF state. Beams for one shot are formed by using the beams which have passed through the limiting aperture member 26 and which are formed during a period from start of the beam ON state to start of the beam OFF state.

The multiple beams MB having passed through the limiting aperture member 26 come into focus by using the objective lens 27, and form a pattern image of a desired reduction ratio. Then, the multiple beams MB are collectively deflected by the deflector 28, and irradiate the substrate 40. For example, while the XY stage 32 continuously moves, the deflector 28 exerts control so that the irradiation positions of the beams track the move of the XY stage 32.

The multiple beams MB radiated at a time are arranged ideally in the pitch obtained by multiplying the arrangement pitch of the holes of the shaping aperture member 23 by the desired reduction ratio described above. The writing apparatus performs a writing operation by using a raster scan method in which shot beams are emitted continuously and sequentially. When a desired pattern is to be written, necessary beams enter the beam ON state in accordance with the pattern by using blanking control.

Figure 2A:
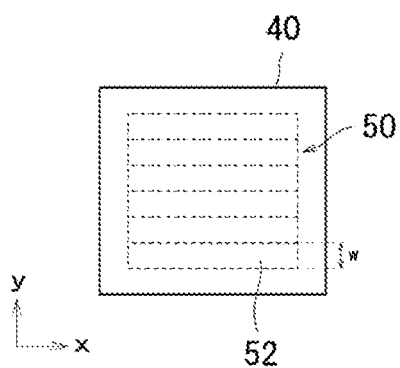
FIGS. 2A to 2E are diagrams for describing a writing method of multiple writing.
Figure 2B:
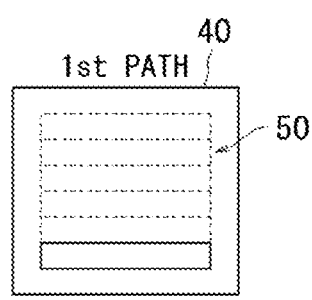
Figure 2C:
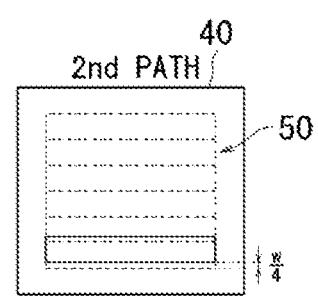
Figure 2D:
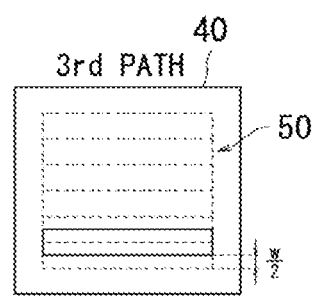
Figure 2E:
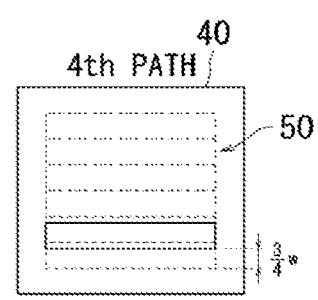

As illustrated in FIG. 2A, a writing area 50 of the substrate 40 is divided virtually, for example, into multiple strip-shaped stripe areas 52 with a given width in the y direction. Each stripe area 52 serves as a writing-unit area.

For example, the XY stage 32 is moved, and adjustment is made so that the irradiation area which may be irradiated with a shot of the multiple beams MB is positioned at the left end of the first stripe area 52, or at the left side of the left end. Then, the writing operation is started. The XY stage 32 is moved in the −x direction. Thus, writing may be performed relatively in the x direction.

The writing apparatus according to the present embodiment performs multiple writing. In multiple writing, in each writing path, the position is shifted in the y direction by one stripe area 52 each time. The position may be shifted not only in the y direction but also in the x direction. For example, when writing is performed with four paths (multiplicity=4) by shifting the position by ¼ of the stripe area width W each time, the irradiation areas in the writing paths are those as in FIGS. 2B to 2E.

That is, in the first path, writing is performed at the position at which the stripe shift amount in the y direction is equal to zero. In the second path, writing is performed at the position at which the stripe shift amount in the y direction is equal to W/4. In the third path, writing is performed at the position at which the stripe shift amount in the y direction is equal to W/2. In the fourth path, writing is performed in the y direction at the position at which the stripe shift amount in the y direction is 3W/4.

Thus, multiple writing is performed by shifting the position, so that beams, with which the same position on the substrate 40 is irradiated, are different depending on the writing paths. Therefore, variations of the current values of the beams may be averaged. In addition, the accuracy of connection between patterns at the position of a boundary between stripe areas may be improved.

FIGS. 3A to 3D are diagrams for describing an exemplary writing operation of a stripe area 52. FIGS. 3A to 3D illustrate an example of performing writing in a stripe area 52, for example, by using multiple beams of 4×4 in the x and y directions. The example corresponds to the first writing path in FIG. 2B.

This example indicates the case in which a stripe area 52 is divided on the basis of the distance between the beams spaced apart from one another. For example, the stripe area 52 is divided by the width equivalent to that of the irradiation area for the entire multiple beams in the y direction. This case indicates that, while the irradiation position is shifted by one mesh each time in the x direction or in the y direction, 16 shots are made until exposure (writing) of one irradiation area for the entire multiple beams ends.

Figure 3A:
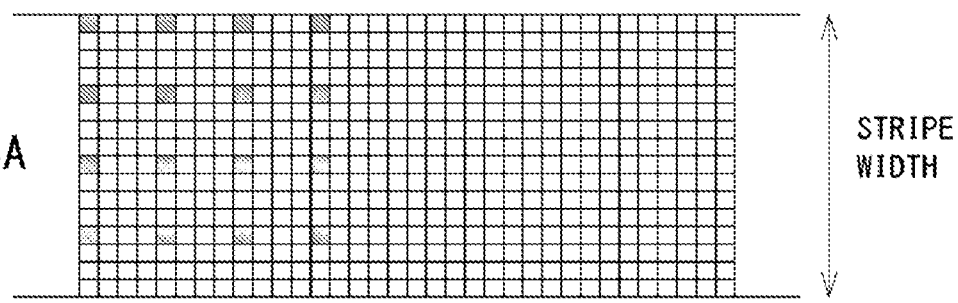
FIGS. 3A to 3D are diagrams for describing an operation of performing writing in a stripe.
Figure 3B:
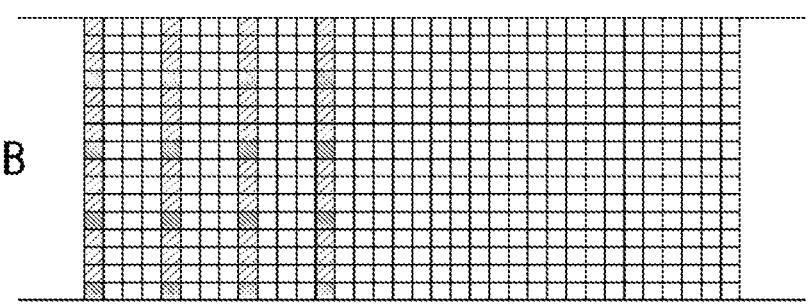
Figure 3C:
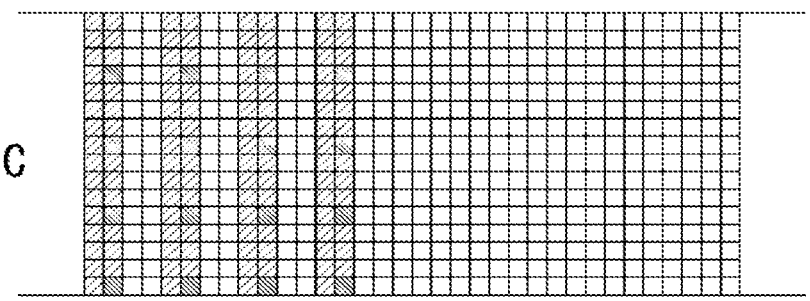
Figure 3D:
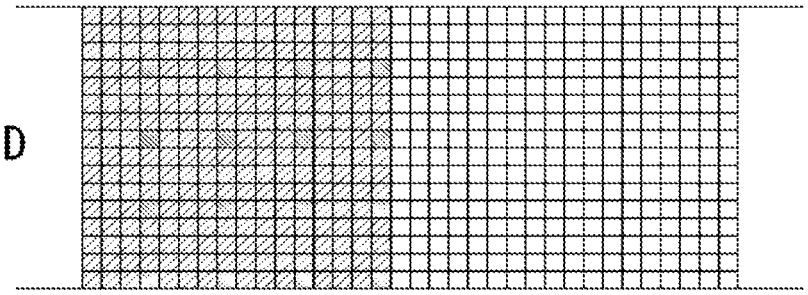

FIG. 3A illustrates mesh (pixel) areas irradiated with one shot. Then, as illustrated in FIG. 3B, while the position is shifted by one pixel each time in the y direction, the second, third, fourth shots are made in this sequence. Then, as illustrated in FIG. 3C, the position is shifted by one pixel in the x direction, and the fifth shot is made. Then, while the position is shifted by one pixel each time in the y direction, the sixth, seventh, eighth shots are made in this sequence. A similar operation is repeatedly performed. As illustrated in FIG. 3D, the remaining ninth to sixteenth shots are made.

In multiple-beam writing, the writing area 50 is divided virtually in a mesh shape with a size of the beam size or less. A beam is emitted onto a mesh (pixel) in which a figure pattern is present. A beam is not emitted onto a mesh in which a figure pattern is not present. Thus, a pattern is written. For example, when an end portion of a figure pattern is positioned in a mesh, the irradiation amount is adjusted. Thus, the position of the end portion of the figure pattern is controlled.

It is necessary to adjust irradiation amounts in order to correct a dimensional variance caused, for example, by the proximity effect. The proximity effect correction calculation may be performed by using a method of the related art. The irradiation time for each beam of the multiple beams is used to control the irradiation amount.

Figure 4:
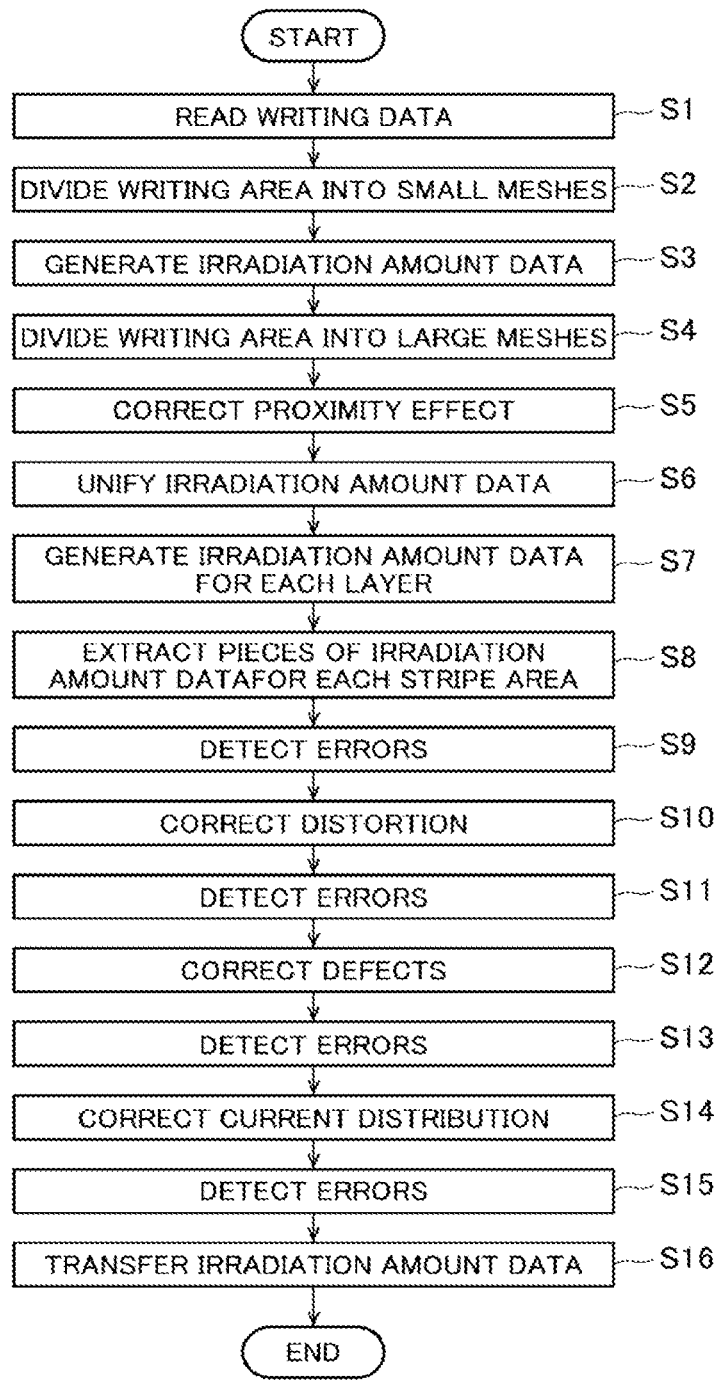
FIG. 4 is a flowchart for describing a data processing method according to the embodiment.

Processes of the units included in the controller 1 (data processing apparatus) will be described according to the flowchart illustrated in FIG. 4.

The bitmap generating unit 11 reads writing data stored in the storage device 10 (step S1). The writing data defines, for example, the arrangement position, the figure type, the figure size, and the like of each figure pattern. In addition to these, the irradiation amount (the irradiation amount for resolving a pattern) which serves as a reference is defined.

The bitmap generating unit 11 divides a writing area into small meshes of several square nm, and assigns the figure pattern, which is defined in the writing data, to the mesh areas (step S2). The bitmap generating unit 11 calculates the areal density of the figure pattern disposed for each mesh area, calculates the irradiation amount for each mesh area (beam irradiation position) on the basis of the areal density, and generates irradiation amount data defining the irradiation amount for each mesh area (step S3).

The bitmap generating unit 11 divides the writing area into large meshes of several square μm, and assigns the figure pattern, which is defined in the writing data, to the mesh areas (step S4). The bitmap generating unit 11 performs proximity effect correction calculation, calculates the irradiation amount, for each mesh position, for suppressing the proximity effect, and generates irradiation amount data defining the irradiation amount for each mesh position (step S5).

The bitmap generating unit 11 unifies the irradiation amount data, which is obtained through the calculation in step S3, and the irradiation amount data obtained through the calculation in step S5 (step S6).

For each mesh position (the pixel corresponding to each beam irradiation position), the bitmap generating unit 11 distributes the irradiation amount evenly to the paths in multiple writing, and generates irradiation amount data for the layer corresponding to each path (step S7). For example, in the case of multiplicity of 4, pieces of irradiation amount data for the first to fourth layers are generated.

For example, as illustrated in FIG. 5, assume the case in which the areas corresponding to the four pixels G1 to G4 are resolved so that a contact hole is formed. When a resist applied to the substrate 40 is resolved with an irradiation amount (exposure amount) of 50 μC, the irradiation amount for each layer is equal to 12.5 μC (=50/4).

The correction unit 12 extracts pieces of irradiation amount data for the respective stripe areas from the irradiation amount data for each layer (step S8). For each stripe area, the correction unit 12 performs data processing.

The error detecting unit 16 performs error detection to check if an error has occurred in the data extraction process in step S8 (step S9). If no errors have occurred, the sums (totals) of the irradiation amounts match one another among the layers. In contrast, if an error has occurred, irradiation amounts change, and the sums of the irradiation amounts do not match one another among the layers. The error detecting unit 16 calculates the sum of the irradiation amounts of each layer, and compares the sums among the layers. If the sums of the irradiation amounts match one another, it is determined that no errors have occurred. If the sums of the irradiation amounts do not match one another, it is determined that an error has occurred.

The distortion correction unit 13 corrects the irradiation amount for each pixel in consideration of, for example, a distortion of the blanking plate 24 and the sensitivity of the resist applied onto the substrate 40 (step S10).

Typically, in a writing apparatus, the beam array of the multiple beams MB emitted onto the substrate 40 may be shifted from the ideal grating due to an error of a hole position of the blanking plate 24, an optical error, or the like. The distortion correction unit 13 refers to a distortion map which defines the amount of shift in position of each beam, and corrects the irradiation amount for each pixel.

After the distortion correction unit 13 corrects the irradiation amounts, the error detecting unit 16 performs error detection (step S11). There are pixels for which the irradiation amounts have been corrected through the correction performed by the distortion correction unit 13 in step S10. The correction is performed so that the sums of the irradiation amounts before and after the correction match one another. Therefore, the sums of the irradiation amounts match one another among the layers. Similarly to step S9, the error detecting unit 16 calculates the sum of the irradiation amounts of each layer, compares the sums among the layers, and determines whether or not the sums match one another.

The defect correction unit 14 corrects the irradiation amounts in consideration of influences of defective beams (step S12). For example, an electrode of a blanker provided for the blanking plate 24 may break down, and an electron beam may fail to be deflected, causing the always-ON defect state. In multiple writing, a beam emitted onto one pixel passes through different blankers depending on the layers. Therefore, for a pixel, onto which a beam having passed through the blanker, having the always-ON defect, in a layer is emitted, normal blankers are used in the other layers to adjust the irradiation amount.

For example, as illustrated in FIG. 6, assume the case in which an always-ON defect has occurred in a blanker through which a beam emitted onto the pixel G4 in the first layer passes, and in which irradiation with 30 μC is performed. Since the resist is to be resolved with an irradiation amount of 50 μC, the irradiation amount for the pixel G4 in each of the second to fourth layers is 6.66 μC (=(50−30)/3).

A hole provided for the shaping aperture member 23 may be clogged due to contamination, and the always-OFF defect state in which a beam is not formed may occur. In multiple writing, beams different depending on the layers are emitted onto one pixel. Therefore, for a pixel in the always-OFF state in one layer, normal beams in the other layers are used to adjust the irradiation amount.

For example, as illustrated in FIG. 7, assume the case in which a beam emitted onto the pixel G4 in the first layer is in the always-OFF state and is not emitted. Since the resist is resolved with an irradiation amount of 50 μC, the pixel G4 in each of the second to fourth layers receives an irradiation amount of 16.6 μC (=50/3).

A beam (blanker) with which such an always-ON defect or always-OFF defect has occurred is found through pre-check. A defect list listing such defects is stored in a storage unit (not illustrated). The defect correction unit 14 refers to the defect list and corrects the irradiation amounts of the other layers so that excess and deficiency of the irradiation amount are compensated.

After the defect correction unit 14 corrects the irradiation amounts, the error detecting unit 16 performs error detection (step S13). As illustrated in FIGS. 6 and 7, irradiation amounts are corrected in order that influences of defective beams are removed. As a result, the sums of the irradiation amounts do not match one another among the layers. Therefore, in consideration of the amounts of correction of the irradiation amounts which is performed by the defect correction unit 14, the error detecting unit 16 compares, with one another, the sums of the irradiation amounts of the layers which have been adjusted on the basis of the correction amounts.

For example, in the irradiation amount data, zero is set to the pixel G4 in the first layer which is in the always-ON defect state as illustrated in FIG. 6. Therefore, the error detecting unit 16 calculates the sum of the irradiation amounts in each layer, and adds 6.66 μC to the sum of the irradiation amounts in the first layer. Then, the error detecting unit 16 compares, among the layers, the sums of the irradiation amounts, and determines whether or not the sums of the irradiation amounts match one another.

Alternatively, the error detecting unit 16 calculates the sum of the irradiation amounts in each layer, and subtracts 6.66 μC from the sum of the irradiation amounts in each of the second to fourth layers. Then, the error detecting unit 16 compares, among the layers, the sums of the irradiation amounts, and determines whether or not the sums of the irradiation amounts match one another.

In the irradiation amount data, zero is set to the pixel G4 in the first layer which is in the always-OFF defect state as illustrated in FIG. 7. Therefore, the error detecting unit 16 calculates the sum of the irradiation amounts in each layer, and adds 16.66 μC to the sum of the irradiation amounts in the first layer. Then, the error detecting unit 16 compares, among the layers, the sums of the irradiation amounts, and determines whether or not the sums of the irradiation amounts match one another.

Alternatively, the error detecting unit 16 calculates the sum of the irradiation amounts in each layer, and subtracts 16.66 μC from the sum of the irradiation amounts in each of the second to fourth layers. Then, the error detecting unit 16 compares, among the layers, the sums of the irradiation amounts, and determines whether or not the sums of the irradiation amounts match one another.

In the case where a remainder obtained when the irradiation amount is indivisible by the number of layers is to be processed, the sum of the irradiation amounts in the layer to which the remainder is added does not match each of the sums in the other layers. Therefore, it is preferable to subtract the remainder from the sum of the irradiation amounts, or to add the same value as the remainder to the sum of the irradiation amounts in each of the other layers.

In a writing apparatus, as a beam position is spaced farther from the center of the blanking plate 24, the beam current may decrease. In addition, due to a defect of the shaping aperture member 23 or the blanking plate 24, a position at which a beam current decrease is present locally. Such a distribution of beam currents is found through pre-check, and a current distribution map is stored in a storage unit (not illustrated). The current-distribution correction unit 15 refers to the current distribution map, and corrects the irradiation amount for each pixel so that the uniform irradiation amounts are present on the surface of the substrate 40 (step S14).

After the current-distribution correction unit 15 corrects the irradiation amounts, the error detecting unit 16 performs error detection (step S15). Due to the correction of irradiation amounts performed by the current-distribution correction unit 15, the sums of the irradiation amounts do not match one another among the layers. Therefore, the error detecting unit 16 refers to the current distribution map, performs a current-distribution inverse operation, and calculates the irradiation amounts before the current-distribution correction. In consideration of the amounts of correction of the irradiation amounts performed by the defect correction unit 14, the error detecting unit 16 compares, among the layers, the sums of the irradiation amounts, and determines whether or not the sums of the irradiation amounts match one another.

If no errors have been detected, the data transfer unit 17 transfers the irradiation amount data to the blanking plate 24 (step S16). Each blanker of the blanking plate 24 controls the voltage applied on the basis of the beam irradiation time according to the irradiation amount data, and switches the beam between ON and OFF.

An irradiation amount defined in the irradiation amount data transferred to the blanking plate 24 by the data transfer unit 17 is expressed as an integer. Therefore, the correction unit 12 performs a rounding process on the fractional portion of the value. For example, when the current-distribution correction unit 15 performs the rounding process, a rounding error occurs, so that the sums of the irradiation amounts do not match one another among the layers. Therefore, it is preferable to allow for a rounding error and compare, among the layers, the sums of the irradiation amounts by using a certain degree of margin which has been set. For example, when the difference in the sum of the irradiation amounts between layers falls within a given range, it is determined that no errors have occurred.

Thus, according to the present embodiment, the sums of the irradiation amounts are compared among the layers, whereby it may be determined whether or not an error has occurred in the data processing. According to the embodiment described above, error detection is performed at the stage after the data extraction process, at the stage after the distortion correction, at the stage after the defect correction, and at the stage after the current-distribution correction. Therefore, a process in which an error occurs may be detected.

The order of the distortion correction, the defect correction, and the current-distribution correction is not particularly limiting.

It is not necessary to perform error detection at all of the stage after the data extraction process, the stage after the distortion correction, the stage after the defect correction, and the stage after the current-distribution correction. Error detection operations may be skipped appropriately. It is preferable to perform error detection at least before the transfer of irradiation amount data performed by the data transfer unit 17.

According to the embodiment described above, the case in which writing is performed in four paths (multiplicity=4) by shifting the position by ¼ of the stripe area width W each time is described. The shift amount and the multiplicity are not limited to these.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A data processing method for processing data in a writing apparatus performing multiple writing by using multiple beams formed of charged-particle beams, the data being data for controlling an irradiation amount for each beam, the method comprising:
    generating irradiation amount data for each of a plurality of layers, the irradiation amount data defining an irradiation amount for each of a plurality of irradiation positions, the plurality of irradiation positions being obtained by dividing a writing area of a substrate in a mesh shape virtually, the substrate being a writing target, the plurality of layers corresponding to writing paths in multiple writing;
    performing a correction process on the irradiation amounts defined in the irradiation amount data provided for each of the plurality of layers; and
    calculating a sum of the irradiation amounts for the respective irradiation positions, the irradiation amounts being defined in the irradiation amount data after the correction process for each of the plurality of layers, comparing the sums between the plurality of layers, and determining whether or not an error has occurred in the correction process on a basis of the comparison result.

2. The data processing method according to claim 1, wherein the correction process includes a correction process on the irradiation amounts based on a beam current distribution map for the substrate, the substrate being a writing target, and
    wherein the irradiation amounts before the correction are obtained by performing a current-distribution inverse operation on the irradiation amount data after the correction process on a basis of the beam current distribution, and it is determined whether or not an error has occurred, by comparing, between the plurality of layers, the sums of the obtained irradiation amounts before the correction.

3. The data processing method according to claim 1, wherein the correction process includes a correction process on the irradiation amounts based on a defect list, the defect list listing a defective beam in the multiple beams, and
    wherein, after the sums of the irradiation amounts are adjusted on a basis of an amount of the correction of the irradiation amounts in the correction process, the sums of the irradiation amounts are compared between the plurality of layers, and it is determined whether or not an error has occurred.

4. The data processing method according to claim 1, wherein the correction process includes a correction process on the irradiation amounts based on a distortion map defining a position shift amount of each beam in the multiple beams, and
    wherein, after the correction of the irradiation amounts based on the distortion map, the sums of the irradiation amounts are compared between the plurality of layers, and it is determined whether or not an error has occurred.

5. The data processing method according to claim 1, wherein the correction process includes an extraction process of extracting, from the irradiation amount data for each of the plurality of layers, pieces of irradiation amount data for a plurality of stripe areas individually, and
    wherein, after the extraction process of the pieces of irradiation amount data, the sums of the irradiation amounts are compared between the plurality of layers, and it is determined whether or not an error has occurred.

6. The data processing method according to claim 1, wherein the correction process includes an extraction process of extracting, from the irradiation amount data for each of the plurality of layers, pieces of irradiation amount data for a plurality of stripe areas individually, a correction process on the irradiation amounts based on a distortion map defining a position shift amount for each beam of the multiple beams, a correction process on the irradiation amounts based on a defect list listing a defective beam in the multiple beams, and a correction process on the irradiation amounts based on a beam current distribution map for the substrate, the substrate being a writing target, and
    wherein, at each of a stage after the extraction process of the pieces of irradiation amount data, a stage after the correction process on the irradiation amounts based on the distortion map, a stage after the correction process on the irradiation amounts based on the defect list, and a stage after the correction process on the irradiation amounts based on the current distribution map, it is determined whether or not the error has occurred.

7. The data processing method according to claim 1, wherein, when a difference in sum between the plurality of layers falls into a given range, it is determined that an error has not occurred.

8. A data processing apparatus for processing data in a writing apparatus performing multiple writing by using multiple beams formed of charged-particle beams, the data being data for controlling an irradiation amount for each beam, the apparatus comprising:
    a generating unit that generates irradiation amount data for each of a plurality of layers, the irradiation amount data defining an irradiation amount for each of a plurality of irradiation positions, the plurality of irradiation positions being obtained by dividing a writing area of a substrate in a mesh shape virtually, the substrate being a writing target, the plurality of layers corresponding to writing paths in multiple writing;

a correction unit that performs a correction process on the irradiation amounts defined in the irradiation amount data provided for each of the plurality of layers; and an error detecting unit that calculates a sum of the irradiation amounts for the respective irradiation positions, the irradiation amounts being defined in the irradiation amount data after the correction process for each of the plurality of layers, that compares the sums between the plurality of layers, and that determines whether or not an error has occurred in the correction process on a basis of the comparison result.

9. The data processing apparatus according to claim 8, wherein the correction process includes a correction process on the irradiation amounts based on a beam current distribution map for the substrate, the substrate being a writing target, and wherein the error detecting unit obtains the irradiation amounts before the correction by performing a current-distribution inverse operation on the irradiation amount data after the correction process on a basis of the beam current distribution, and determines whether or not an error has occurred, by comparing, between the plurality of layers, the sums of the obtained irradiation amounts before the correction.

10. The data processing apparatus according to claim 8, wherein the correction process includes a correction process on the irradiation amounts based on a defect list, the defect list listing a defective beam in the multiple beams, and wherein, after adjusting the sums of the irradiation amounts on a basis of an amount of the correction of the irradiation amounts in the correction process, the error detecting unit compares, between the plurality of layers, the sums of the irradiation amounts, and determines whether or not an error has occurred.

11. The data processing apparatus according to claim 8, wherein the correction process includes a correction process on the irradiation amounts based on a distortion map defining a position shift amount of each beam in the multiple beams, and wherein, after the correction of the irradiation amounts based on the distortion map, the error detecting unit compares, between the plurality of layers, the sums of the irradiation amounts, and determines whether or not an error has occurred.

12. The data processing apparatus according to claim 8, wherein the correction process includes an extraction process of extracting, from the irradiation amount data for each of the plurality of layers, pieces of irradiation amount data for a plurality of stripe areas individually, and wherein, after the extraction process of the pieces of irradiation amount data, the error detecting unit compares, between the plurality of layers, the sums of the irradiation amounts, and determines whether or not an error has occurred.

13. The data processing apparatus according to claim 8, wherein the correction process includes an extraction process of extracting, from the irradiation amount data for each of the plurality of layers, pieces of irradiation amount data for a plurality of stripe areas individually, a correction process on the irradiation amounts based on a distortion map defining a position shift amount for each beam of the multiple beams, a correction process on the irradiation amounts based on a defect list listing a defective beam in the multiple beams, and a correction process on the irradiation amounts based on a beam current distribution map for the substrate, the substrate being a writing target, and wherein, at each of a stage after the extraction process of the pieces of irradiation amount data, a stage after the correction process on the irradiation amounts based on the distortion map, a stage after the correction process on the irradiation amounts based on the defect list, and a stage after the correction process on the irradiation amounts based on the current distribution map, the error detecting unit determines whether or not the error has occurred.

14. A multiple charged-particle beam writing apparatus comprising:

a stage that is movable with a substrate placed thereon, the substrate being a writing target;

an emitting unit that emits a charged-particle beam;

a shaping aperture plate including a plurality of opening portions, and forming multiple beams by allowing the charged-particle beam to pass through the plurality of opening portions;

a blanking plate that has a plurality of blankers performing blanking deflection of the respective beams of the multiple beams;

a generating unit that generates irradiation amount data for each of a plurality of layers, the irradiation amount data defining an irradiation amount for each of a plurality of irradiation positions, the plurality of irradiation positions being obtained by dividing a writing area of a substrate in a mesh shape virtually, the substrate being a writing target, the plurality of layers corresponding to writing paths in multiple writing;

a correction unit that performs a correction process on the irradiation amounts defined in the irradiation amount data provided for each of the plurality of layers; and an error detecting unit that calculates a sum of the irradiation amounts for the respective irradiation positions, the irradiation amounts being defined in the irradiation amount data after the correction process for each of the plurality of layers, that compares the sums between the plurality of layers, and that determines whether or not an error has occurred in the correction process on a basis of the comparison result; and a data transfer unit that, when it is determined that an error has not occurred, transfers the irradiation amount data after the correction process to the blanking plate.

15. The apparatus according to claim 14, wherein the correction process includes a correction process on the irradiation amounts based on a beam current distribution map for the substrate, the substrate being a writing target, and wherein the error detecting unit obtains the irradiation amounts before the correction by performing a current-distribution inverse operation on the irradiation amount data after the correction process on a basis of the beam current distribution, and determines whether or not an error has occurred, by comparing, between the plurality of layers, the sums of the obtained irradiation amounts before the correction.

16. The apparatus according to claim 14, wherein the correction process includes a correction process on the irradiation amounts based on a defect list, the defect list listing a defective beam in the multiple beams, and wherein, after adjusting the sums of the irradiation amounts on a basis of an amount of the correction of the irradiation amounts in the correction process, the error detecting unit compares, between the plurality of layers, the sums of the irradiation amounts, and determines whether or not an error has occurred.

17. The apparatus according to claim 14,
wherein the correction process includes a correction process on the irradiation amounts based on a distortion map defining a position shift amount of each beam in the multiple beams, and
wherein, after the correction of the irradiation amounts based on the distortion map, the error detecting unit compares, between the plurality of layers, the sums of the irradiation amounts, and determines whether or not an error has occurred.

18. The apparatus according to claim 14,
wherein the correction process includes an extraction process of extracting, from the irradiation amount data for each of the plurality of layers, pieces of irradiation amount data for a plurality of stripe areas individually, and
wherein, after the extraction process of the pieces of irradiation amount data, the error detecting unit compares, between the plurality of layers, the sums of the irradiation amounts, and determines whether or not an error has occurred.

19. The apparatus according to claim 14,
wherein the correction process includes an extraction process of extracting, from the irradiation amount data for each of the plurality of layers, pieces of irradiation amount data for a plurality of stripe areas individually, a correction process on the irradiation amounts based on a distortion map defining a position shift amount for each beam of the multiple beams, a correction process on the irradiation amounts based on a defect list listing a defective beam in the multiple beams, and a correction process on the irradiation amounts based on a beam current distribution map for the substrate, the substrate being a writing target, and
wherein, at each of a stage after the extraction process of the pieces of irradiation amount data, a stage after the correction process on the irradiation amounts based on the distortion map, a stage after the correction process on the irradiation amounts based on the defect list, and a stage after the correction process on the irradiation amounts based on the current distribution map, the error detecting unit determines whether or not the error has occurred.

\* \* \* \* \*